United States Patent [19]

Stahlhofen

[11] 4,387,152
[45] Jun. 7, 1983

[54] LIGHT-SENSITIVE MIXTURE AND COPYING MATERIAL PREPARED THEREFROM, AND PROCESS FOR THE PREPARATION OF A PRINTING FORM FROM THE COPYING MATERIAL

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 313,354

[22] Filed: Oct. 20, 1981

[30] Foreign Application Priority Data

Oct. 23, 1980 [DE] Fed. Rep. of Germany ....... 3039926

[51] Int. Cl.$^3$ .......................... G03C 1/52; G03C 1/58
[52] U.S. Cl. ..................................... 430/191; 430/192; 430/193; 430/280; 430/309; 430/330; 430/331; 430/350
[58] Field of Search ............... 430/191, 192, 270, 280, 430/309, 330, 331, 193, 350

[56] References Cited

U.S. PATENT DOCUMENTS

| | | | |
|---|---|---|---|
| 3,130,048 | 4/1964 | Fritz et al. | 430/192 |
| 3,779,778 | 12/1973 | Smith et al. | 430/270 |
| 4,101,323 | 7/1978 | Buhr et al. | 430/270 |
| 4,160,671 | 7/1979 | Stahlhofen | 430/191 |
| 4,247,611 | 1/1981 | Sander et al. | 430/191 |
| 4,265,999 | 5/1981 | Schell. | |

FOREIGN PATENT DOCUMENTS 1555233 11/1979 United Kingdom .
1561438 2/1980 United Kingdom .

Primary Examiner—J. Travis Brown
Attorney, Agent, or Firm—Schwartz, Jeffery, Schwaab, Mack, Blumenthal & Koch

[57] ABSTRACT

A light-sensitive mixture is disclosed which contains a water-insoluble, aqueous-alkali-soluble binder, a light-sensitive o- or p-quinone-diazide or a mixture of (a) a compound which generates or splits off an acid on exposure to light and (b) a compound having at least one C—O—C group which can be cleaved by acid, and a phenol compound having 1 to 3 benzene nuclei which are mutually linked by single bonds, carbonyl groups, ether groups, thioether groups or optionally substituted methylene groups, and having at least one phenolic hydroxyl group and at least two substituents of the formula —CH$_2$OR, in which R is hydrogen or a lower alkyl or acyl group. The mixture is used for the preparation of light-sensitive copying material, preferably for the preparation of planographic printing forms. The addition of the phenolic compound has the effect that the developed printing forms can be baked at lower temperatures than hitherto in order to extend the printing run.

20 Claims, No Drawings

LIGHT-SENSITIVE MIXTURE AND COPYING MATERIAL PREPARED THEREFROM, AND PROCESS FOR THE PREPARATION OF A PRINTING FORM FROM THE COPYING MATERIAL

BACKGROUND OF THE INVENTION

The present invention relates to a light-sensitive mixture which contains a water-insoluble binder, which is soluble in aqueous-alkaline solutions, and a light-sensitive compound, as well as to a light-sensitive copying material composed of a support and a light-sensitive layer constituted by the mixture, and to a process for the preparation of a printing form by exposing, developing and heating the copying material.

Processes for the preparation of printing forms by heating or baking of the image layer of exposed and developed copying materials have been disclosed, for example, in British patent specifications Nos. 1,151,199 and 1,154,749. In these processes, a light-sensitive copying material, which is either positive-working and preferably contains an o-quinone-diazide or is negative-working and preferably contains a p-quinone-diazide, is exposed imagewise, developed and then heated to a temperature above 180° C. for such a period and to such a temperature level that the image background, previously developed cleanly, is stained by thermal decomposition products of the image layer. Subsequently, the image background is cleaned again by once more treating it with developer solution. Normally, temperatures of 220°-240° C. are used for heating, and the duration of heating is about 5-60 minutes. This after-treatment achieves a hardening of the printing layer and hence a considerable extension of the print run. When the baking temperatures are at the upper limit of the indicated range, the required baking times are of course relatively short. It has been found that the use of relatively high temperatures in this process is disadvantageous. On the one hand, these temperatures cause the formation of a relatively firmly adhering precipitate in the background areas, and this can be cleanly removed only by means of relatively aggressive solutions, and by so doing there is also a risk of an attack on the printing stencil. Secondly, at the relatively high baking temperatures or with the relatively long baking times, there is a risk that the conventionally used supports of aluminum will be deformed and that the printing form obtained will be damaged or rendered useless.

As described in German Offenlegungsschrift No. 2,626,473, the first-mentioned disadvantage can be avoided by coating the background surface before baking with a layer of a water-soluble organic substance or an inorganic salt, which layer can be readily washed off after baking. To prevent a deformation of the support, it would be desirable however, to be able to bake at lower temperatures.

German Offenlegungsschrift No. 2,547,905 has disclosed a light-sensitive mixture of the generic type described here which, in addition to an o-quinone-diazide and an alkali-soluble binder, contains a low-molecular phenol derivative, for example, 2,3,4-trihydroxy-benzophenone. The phenol derivative has the purpose of improving the adhesion of the light-sensitive layer to the support, independently of a possible baking step.

SUMMARY OF THE INVENTION

It is an object of the present invention to provide an improved light-sensitive mixture and a copying material prepared from this mixture.

In particular, it is an object of the invention to provide an improved light-sensitive mixture and copying material which enable baking to be carried out at lower temperatures without, as a result, reducing the length of print run obtained with the baked printing form.

Still another object of the invention is to provide an improved process for producing a printing form from the light-sensitive copying material.

In accomplishing the foregoing objects, there has been provided in accordance with the present invention a light-sensitive mixture, comprising a water-insoluble binder which is soluble in aqueous-alkaline solutions; a light-sensitive component selected from o- or p-quinone-diazides or a mixture of (a) a compound which generates or splits off an acid on exposure to light and (b) a compound having at least one C—O—C group which can be cleaved by acid; and a phenol derivative comprising a compound having from 1 to 3 benzene nuclei which are mutually linked by single bonds, carbonyl groups, ether groups, thioether groups or unsubstituted or substituted methylene groups, and having at least one phenolic hydroxyl group and at least two substituents of the formula —$CH_2OR$, in which R denotes hydrogen or a lower alkyl or acyl group.

In accordance with another aspect of the present invention, there has been provided a light-sensitive copying material, comprising a support and a light-sensitive layer on the support, wherein the light-sensitive layer comprises a light-sensitive mixture as defined above.

According to another aspect of the invention, there is provided a process for preparing a printing form comprising the steps of imagewise exposing a light-sensitive copying material comprising a support and a light-sensitive layer on the support, wherein the light-sensitive layer comprises a water-insoluble binder which is soluble in aqueous-alkaline solutions, a light-sensitive component selected from o- or p-quinone-diazides or a mixture of (a) a compound which generates or splits off an acid on exposure to light and (b) a compound having at least one C—O—C group which can be cleaved by acid, and a phenol derivative comprising a compound having 1 to 3 benzene nuclei which are mutually linked by single bonds, carbonyl groups, ether groups, thioether groups or unsubstituted or substituted methylene groups, and having at least one phenolic hydroxyl group and at least two substituents of the formula —$CH_2OR$, in which R denotes hydrogen or a lower alkyl or acyl group; washing out the non-image areas with an aqueous-alkaline developer solution; and heating the developed printing form to an elevated temperature sufficient to harden the image layer, preferably to a temperature in the range from about 150° to 240° C. for about 1 to 20 minutes.

Further objects, features and advantages of the present invention will become apparent from the detailed description of preferred embodiments which follows.

DETAILED DESCRIPTION OF PREFERRED EMBODIMENTS

The invention begins with a light-sensitive mixture containing a water-insoluble binder, which is soluble in aqueous-alkaline solutions, a light-sensitive o- or p-quinone-diazide or a mixture of (a) a compound which generates or splits off an acid on exposure to light and (b) a compound having at least one C—O—C group which can be cleaved by acid, and a phenol derivative.

In the mixture according to the invention, the phenol derivative is a compound having 1 to 3 benzene nuclei which are mutually linked by single bonds, carbonyl groups, ether groups, thioether groups or optionally substituted methylene groups, and having at least one phenolic hydroxyl group and at least two substituents of the formula —CH$_2$OR, in which R is a hydrogen atom, or a lower alkyl or acyl group.

Furthermore, according to the inventon, a light-sensitive copying material is provided which is composed of a support and a light-sensitive layer constituted by the mixture defined above.

Moreover, according to the invention, a process for the preparation of a printing form is provided, wherein a light-sensitive copying material composed of a support and a light-sensitive layer containing a water-insoluble binder, which is soluble in aqueous-alkaline solutions, a light-sensitive o- or p- quinone-diazide or a mixture of (a) a compound which generates or splits off an acid on exposure to the light and (b) a compound having at least one C—O—C group which can be cleaved by acid, and a phenol derivative, is exposed imagewise, the non-image areas of the layer are washed out with an aqueous-alkaline developer solution and the material is then heated to an elevated temperature in order to harden the image layer. This process utilizes the light-sensitive copying material defined above.

The phenol derivatives contained in the mixture according to the invention can, for example, correspond to one of the general formulae I and II

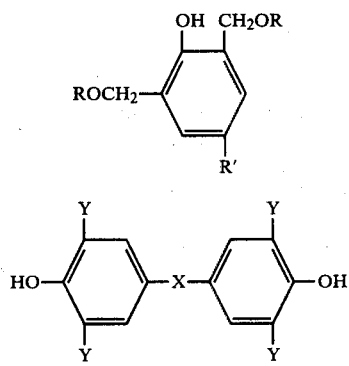

in which R is a hydrogen atom, a lower alkyl group or a lower acyl group, R' is an alkyl, alkoxy, cycloalkyl, aryl, aryloxy, acyl or aralkyl group or a halogen atom, X is a single bond or one of the groups S, O, CO or CR$_1$R$_2$ and Y is a hydrogen atom or a CH$_2$OR group, and R$_1$ and R$_2$ are identical or different and can be hydrogen atoms or substituted or unsubstituted alkyl groups which can be linked together to form a ring. Not more than two of the substituents Y are hydrogen atoms.

In general, because of their high reactivity, those compounds are preferred in which R is a hydrogen atom. If R is an alkyl group, the latter normally has 1 to 4 carbon atoms and preferably is a methyl group.

Among the lower acyl groups, those having 2 to 4 carbon atoms, in particular the acetyl group, are preferred.

Because of their strong crosslinking effect, compounds of the formula II, in particular the representatives in which all the Y substituents are CH$_2$OR groups, are preferred.

Among these compounds, also preferred are those in which X is a methylene group, above all a substituted methylene group. Compounds with X=prop-2,2-ylene are especially preferred. Examples of possible substituents for the methylene group are alkyl groups, alkoxyalkyl groups, carboxyalkyl groups, hydroxyalkyl groups, acylalkyl groups, acyloxyalkyl groups, alkoxycarbonylalkyl groups or halogenoalkyl groups, each having 1 to 5 carbon atoms. If the substituents are linked to form a ring, the latter preferably has 5 or 6 members.

Among the compounds of the formula I, preferred are those in which R' is an alkyl group having 1 to 12 carbon atoms, a cycloalkyl group having 5 to 8 carbon atoms, an alkoxy group having 1 to 5 carbon atoms, an aryl group having 6 to 10 carbon atoms, an aralkyl group having 7 to 10 carbon atoms, or a chlorine or bromine atom.

The preparation of the phenol-alcohol of the formula I is carried out by reacting the corresponding phenol derivative with formaldehyde in a strongly alkaline medium at temperatures of about 15°–50° C., preferably at room temperature.

Depending on the activity of the starting phenol and the quantity of the formaldehyde used, the reaction proceeds over periods of less than one hour up to several days. By careful neutralization with dilute hydrochloric acid, the free phenol-alcohols are separated out either in a highly viscous form or in a crystallized form. The reaction products are dehydrated in vacuo at an internal temperature which is between room temperature and 50° C.

In the table which follows, some of the 4-substituted hydroxymethyl-phenols according to the general formula I are listed, which are suitable as an additive for the mixture according to the invention.

| R' | Melting point °C. |
| --- | --- |
| Methyl | 130 |
| Ethyl | 86 |
| n-Octyl | 73 |
| n-Butyl | 67 |
| tert.-Butyl | 74 |
| Methoxy | 128 |
| Phenyl | 111 |
| Benzyl | 86 |
| Cyclohexyl | 106–107 |
| Chlorine | 156 |
| Bromine | 152 |

Some of the hydroxymethylphenols listed are described in "Journal fuer praktische Chemie", Volume 152 (1939), page 126; Volume 153 (1939), page 327, and in the Monograph by R. W. Martin: "The Chemistry of Phenolic Resins." The disclosures of these publications are incorporated by reference herein.

In the table which follows, several suitable phenol-alcohols of the formula II are listed, in which all of the Y substituents are CH$_2$OH.

| x | Melting point °C. |
| --- | --- |
| Methylene | 145 |

-continued

| x | Melting point °C. |
|---|---|
| Prop-2,2-ylene | — |
| Cyclohex-1,1-ylene | 115 |
| 1,1,1-Trichloro-eth-2,2-ylene | >300 |
| 4-Carboxy-but-2,2-ylene | 120 |
| Single bond | 125 |

Because of the superior stability and storage life of the light-sensitive mixtures thus provided according to the invention, the hydroxymethylphenols substituted in the 4-position relative to the OH group are preferred since methylol groups in the o-position relative to the phenolic OH group are stabilized by the formation of intramolecular hydrogen bridges, with six-membered rings being formed. This stabilization of methylol groups in the o-position is destroyed only by heating, and condensation reactions on the methylol groups are initiated, which effect the hardening of the layer.

The behavior of the corresponding compounds in which the methylol groups are esterified or etherified is similar to that of the free phenol-alcohols. However, the reaction of these compounds is somewhat more sluggish than that of phenol-alcohols, so that in most cases they require somewhat higher baking temperatures. For this reason, they are not preferred to the same extent.

The concentration of the hydroxymethylphenols in the light-sensitive mixture can vary within relatively wide limits. In general, the proportion is from about 5 to 60 by weight, and preferably it is between about 10 and 35% by weight, relative to the weight of the non-volatile constituents of the light-sensitive mixture.

Additionally, the light-sensitive mixtures according to the invention contain a light-sensitive compound. Above all, positive-working compounds, i.e., those which are rendered soluble by exposure, are suitable for this purpose. They include o-quinone-diazides and combinations of photolytic acid donors and compounds which can be cleaved by acid, such as orthocarboxylic acid compounds and acetal compounds.

The mixture and process according to the invention have particular advantages in connection with light-sensitive materials based on o-quinone-diazides, since in this case a particularly large increase in the number of prints is obtained by baking. Suitable materials of this type are known and described, for example, in German Pat. No. 938,233 and German Offenlegungsschriften No. 2,331,377, No. 2,547,905 and No. 2,828,037, the disclosures of which are hereby incorporated by reference. The preferred o-quinone-diazides are naphthoqui-none-(1,2)-diazide-(2)-4- or 5-sulfonic acid esters or amides. Among these, esters, in particular those of the 5-sulfonic acids, are particularly preferred. In general, the quantity of o-quinone-diazide compounds is from about 3 to 50% by weight, preferably from about 7 to 35% by weight, relative to the non-volatile constituents of the mixture.

Materials based on compounds which can be cleaved by acid can also be baked with good effect and used in the process according to the invention.

Copying materials of this type are known and described, for example, in U.S. Pat. No. 3,779,778 and No. 4,101,323, German Pat. No. 2,718,254 and German Offenlegungsschriften No. 2,829,512 and No. 2,829,511. The disclosures are also incorporated by reference herein. As the compounds which can be cleaved by acid, they contain ortho-carboxylic acid derivatives, monomeric or polymeric acetals, enol ethers or acyliminocarbonates. As the compounds which are sensitive to radiation and generate or split off acid, the copying materials predominantly contain organic halogen compounds, in particular s-triazines which are substituted by halogenomethyl groups.

Among the ortho-carboxylic acid derivatives described in U.S. Pat. No. 4,101,323, particularly the diphenoxymethyl esters of aliphatic or aromatic hydroxy compounds, the N-diphenoxymethyl derivatives of lactams and, especially, the bis-1,3-dioxan-2-yl ethers of aliphatic diols are preferred.

Among the polyacetals described in German Pat. No. 2,718,254, those with aliphatic aldehyde units and diol units are preferred.

Further, very suitable mixtures are described in German Patent Application P 29 28 636.0, the disclosure of which is hereby incorporated by reference. In the latter, polymeric ortho-esters having recurrent ortho-ester groups in the main chain are described as compounds which can be cleaved by acid.

These groups are 2-alkyl ethers of 1,3-dioxacycloalkanes having 5 or 6 ring members. Polymers with recurrent 1,3-dioxa-cyclohex-2-yl alkyl ether units, in which the alkyl ether group can be interrupted by ether oxygen atoms and is preferably bonded to the 5-position of the adjacent ring, are particularly preferred. Some of these polymeric ortho-esters are also described in German Offenlegungsschrift No. 2,715,502, the disclosure of which is also incorporated by reference herein.

The quantitative proportion of the compounds which can be cleaved by acid in the light-sensitive mixture is in general between about 8 and 65% by weight, preferably between about 14 and 44% by weight, relative to the non-volatile constituents of the mixture. The quantity of the compound which eliminates acid is between about 0.1 and 10% by weight, preferably between about 0.2 and 5% by weight.

Additionally, the light-sensitive mixtures according to the invention contain a polymeric, water-insoluble resinous binder which is soluble in the solvents used for the mixture according to the invention and is also soluble, or at least swellable, in aqueous alkali solutions.

The novolak condensation resins, well-established in many positive copying materials based on naphthaquinone-diazides, have also proved to be particularly usefl and advantageous as an additive in the mixture according to the invention. They enhance the sharp differentiation between exposed and unexposed layer areas on developing. This is particularly true for the more highly condensed resins with substituted phenols, for example, cresols, as the reaction partners for the condensation with formaldehyde. The nature and quantity of the novolak resins can vary depending on the intended purpose. Preferably, the proportion of novolak in the total solids is between about 90 and 50% by weight, and particularly preferably between about 80 and 60% by weight. Moreover, numerous other resins can also be used in addition. Preferably these are vinyl polymers, such as polyvinyl acetates, polyacrylates, polyvinyl ethers, polyvinylpyrrolidones and copolymers of the monomers on which these are based. The most advantageous proportion of these resins depends on the technological requirements and on the influence on the developing conditions and, in general, this is not more than about 20% by weight of the alkali-soluble resin. To meet special requirements, such as flexibility, adhesion, gloss, coloration and color change, and the like, the light-sensitive mixture can additionally also contain small amounts of substances, such as polyglycols, cellulose derivatives, such as ethylcellulose, wetting agents, dyes, adhesion-promoters, and finely divided pigments, and also UV absorbers, if required. Natural resins, such as shellac and colophony, and synthetic resins, such as copolymers of styrene and maleic anhydride or copolymers of acrylic acid or methacrylic acid, in particular with acrylates or methacrylates, should also be mentioned as further binders which are soluble or swellable in alkali.

For coating a suitable support, the mixtures are in general dissolved in a solvent. The selection of the solvents must be matched to the envisaged coating process, the layer thickness and the drying conditions. Suitable solvents for the mixture according to the invention are ketones, such as methyl ethyl ketone, chlorinated hydrocarbons, such as trichloroethylene and 1,1,1-trichloroethane, alcohols, such as n-propanol, ethers such as tetrahydrofuran, alcoholethers, such as ethylene glycol monoethyl ether, and esters, such as butyl acetate. It is also possible to use mixtures which, for special purposes, can also contain solvents, such as acetonitrile, dioxane or dimethylformamide. In principle, all those solvents can be used which do not irreversibly react with the layer components.

The supports used for layer thicknesses of less than about 10 μm are in most cases metals. The following may be used for offset printing plates: bright-rolled, mechanically or electrochemically roughened aluminum which, if desired, has been anodized and which additionally can also have been chemically pretreated, for example, with polivinylphosphonic acid, silicates, hexafluorozirconates, hydrolized tetraethyl orthosilicate or phosphates.

Coating of the support material is carried out in a known manner by spin-coating, spraying, dipping, rolling, by means of slot dies, doctor-knives or by coater application.

Light sources customary in the industry are used for exposure. Irradiation with electrons or a laser is another possibility for producing an image.

The aqueous-alkaline solutions which are used for developing and which have graduated alkalinity, that is to say, they have a pH which preferably is between about 10 and 14, and which can also contain minor amounts of organic solvents or wetting agents, remove those areas of a copying layer which have been irradiated by light, and thus produce a positive image of the original.

The preferred use of the light-sensitive mixtures according to the invention is in the preparation of printing forms, in particular offset printing forms, using aluminum as the support.

After developing, the printing form is heated in a manner known per se. In contrast to the process conditions hitherto customary in baking, such as are indicated, for example, in British patent specification No. 1,154,749 or German Offenlegungsschrift No. 2,939,785, it is possible with an addition of the hydroxymethylphenols defined above to achieve the same increase in the print run as hitherto at markedly lower temperatures or within substantially shorter periods. The baking temperatures selected can be in the range from about 150° to 240° C., preferably from about 160° to 210° C., with heating periods of from about 1 to 20, preferably from about 5 to 15, minutes being normally required. If the support material is stable at higher temperatures, it is of course also possible to bake at higher temperatures above 240° C. and to select correspondingly shorter heating periods.

The support, once bared after developing of the image, can also be treated in a known manner with the aqueous solution of a film-forming substance before heating, in order to save, or at least to facilitate, the redeveloping after heating. This treatment can also be useful in the process according to the invention, but it is not necessary. In particular, when the preferred low baking temperatures are used, precipitates on the background areas of the plate are in most cases not formed at all, or they can be readily removed. If the process is carried out in the preferred manner, this step can therefore be omitted.

The invention is explained in more detail by reference to the examples which follow, wherein parts by weight (p.b.w.) and parts by volume (p.b.v.) have the same relationship as that of the g to the $cm^3$. Unless otherwise stated, percentages are expressed in percent by weight.

EXAMPLE 1

An electrochemically roughened and anodized aluminum plate is coated with a solution of 1 part by weight of the esterification product obtained from 1 mole of 2,3,4-trihydroxy-benzophenone and 2 moles of naphthoquinone-(1,2)-diazide-(2)-5-sulfonic acid chloride;

0.7 part by weight of the esterification product obtained from 1 mole of 2,2'-dihydroxy-dinaphthyl-(1,1')-methane and 2 moles of naphthoquinone-(1,2)-diazide-(2)-5-sulphonic acid chloride;

4.25 parts by weight of a cresol/formaldehyde novolak having a softening point of 105°–120° C.;

0.12 part by weight of 4-(p-tolylmercapto)-2,5-diethoxybenzene-diazonium hexafluorophosphate;

1.3 parts by weight of 2,2-bis-(4-hydroxy-3,5-bis-hydroxy-methyl-phenyl)-propane; and 0.07 part by weight of crystal violet in 40 parts by weight of ethylene glycol monomethyl ether and 50 parts by weight of tetrahydrofuran.

Before application of the light-sensitive copying layer, the anodized support is treated with an aqueous solution of 0.1% by weight of polyvinylphosphonic acid, as described in German Patent No. 1,621,478.

The presensitized material, thus prepared and having a layer weight of 2.20 g/m², is exposed imagewise under a transparent positive original and then developed with the following solution:

5.3 parts by weight of sodium metasilicate×9 water;

3.4 parts by weight of trisodium phosphate×12 water; and 0.3 part by weight of sodium dihydrogen phosphate (anhydrous) in 91 parts by weight of water.

The areas of the copying layer struck by light are removed by developing and the unexposed image areas remain on the support, with a printing stencil corresponding to the original being obtained.

In an offset printing press, it is possible to obtain 100,000 perfect prints from the printing form thus prepared.

In order to extend the print run and to harden the printing stencil, the printing form is subjected to a heat treatment. For this purpose, the dried printing form, after developing, is heated in a baking oven for 10 minutes at 175° C. or for 20 minutes at 150° C.

As a result of heating the printing form in the oven, the printing stencil is hardened and the layer becomes insoluble in organic solvents, such as acetone or alcohols, dimethylformamide, xylene or acetic anhydride. 350,000 perfect copies are obtained in an offset printing press.

When the hydroxymethylphenol derivative is omitted and, to maintain the layer weight, the novolak proportion increased by the same amount, a run of only 150,000 is obtained under otherwise identical trial conditions. Moreover, the printing stencil remained as soluble in organic solvents as before and was not resistant to correcting agents.

If, in place of the hydroxymethylphenol derivative, the same quantity of a commercially available resole resin is used, no increase in the print run is obtained under the same conditions, as compared with the plate which contains only novolak.

The advantage of the printing form obtained according to the invention by Example 1 is demonstrated in the summary below.

| BAKING TIME IN MINUTES | BAKING TEMPERATURE IN °C. | ADDITION OF HYDROXYMETHYL PHENOL | RESISTANCE TO SOLVENTS | PRINT RUN |
|---|---|---|---|---|
| 8 | 180 | + | resistant | 350,000 |
| — | — | — | none | 100,000 |
| — | — | + | none | 100,000 |
| 8 | 180 | — | none | 150,000 |
| 8 | 180 | * | none | 150,000 |
| 8 | 210 | — | none | 180,000 |
| 5 | 240 | — | resistant | 300,000 |
| 5 | 240 | + | resistant | 500,000 |

*Addition of 1.3 parts by weight of resole instead of hydroxymethylphenol

The above results clearly show that, as the result of the addition to the copying layer of a hydroxymethylphenol according to the invention, the baking temperature can be substantially reduced in order to obtain the same results, in terms of copying and printing technology, as are obtained, for example, at 240° C. without the addition of a hydroxymethylphenol.

Essentially, the advantage is that baking ovens of lower power can be used and, above all, that the strength of aluminum as the support remains preserved at the relatively low baking temperatures indicated in accordance with the invention. It is known that the deformability of aluminum rises significantly above 240° C., which makes the further handling of such baked printing forms much more difficult in practice, and frequently makes this even impossible.

In the examples which follow, further coating solutions are indicated, with similar results being obtained. Unless specially noted, the preparation and processing of the printing plates thus obtained correspond to the conditions described in Example 1.

EXAMPLE 2

An electrochemically roughened and anodized aluminum plate, the surface of which has been pretreated with an aqueous solution of polyvinylphosphonic acid, is coated with a solution of 1.36 parts by weight of the esterification product obtained from 1 mole of the ethoxyethyl ester of 4,4-bis-(4-hydroxyphenyl)-n-valeric acid and 2 moles of naphthoquinone-(1,2)-diazide-(2)-5-sulfonic acid chloride;

0.12 part by weight of naphthoquinone-(1,2)-diazide-(2)-4-sulfonic acid chloride;

4.6 parts by weight of the novolak indicated in Example 1;

1.3 parts by weight of 1,1-bis-(4-hydroxy-3,5-bis-hydroxy-methyl-phenyl)-cyclohexane; and 0.07 part by weight of crystal violet in 40 parts by weight of ethylene glycol monomethyl ether and 50 parts by weight of tetrahydrofuran.

The starting product for the preparation of the hydroxymethylphenol derivative indicated in Example 2, namely, 1,1-bis-(4-hydroxy-phenyl)-cyclohexane (melting point 184° C.), is obtained in good yield by passing dry hydrogen chloride gas through a solution of 2 moles of phenol and 1 mole of cyclohexanone in toluene, with stirring and cooling.

A baking time of the printing form amounting to 10 minutes at 170° C. is adequate for the hardening of the printing stencil, as well as the associated lengthening of the print run and the resistance to solvents.

EXAMPLE 3

An electrochemically roughened and anodized aluminum plate is coated with a solution of 1.1 parts by weight of the esterification product obtained from 1 mole of 2,3,4-trihydroxy-benzophenone and 3 moles of naphthoquinone-(1,2)-diazide-(2)-5-sulfonic acid chloride;

0.7 part by weight of the esterification product obtained from 1 mole of 2,2'-dihydroxy-dinaphthyl-(1,1')-methane and 2 moles of naphthoquinone-(1,2)-diazide-(2)-5-sulfonic acid chloride;

4.1 parts by weight of the novolak indicated in Example 1;

1.4 parts by weight of 4-methyl-2,6-bis-hydroxymethylphenol;

0.15 parts by weight of naphthoquinone-(1,2)-diazide-(2)-4-sulfonic acid chloride; and 0.07 part by weight of crystal violet in 40 parts by weight of ethylene glycol monomethyl ether and 50 parts by weight of tetrahydrofuran.

A baking time of the printing form amounting to 10 minutes at 180° C. is adequate for the hardening of the printing stencil, as well as for the associated lengthening of the print run and the resistance to solvents.

EXAMPLE 4

An aluminum plate mechanically roughened by means of wire brushes is coated with a solution of 2 parts by weight of 1-(4-methyl-benzenesulfonylimino)-2-(2-ethyl-phenylaminosulfonyl)-benzoquinone-(1,4)-diazide-(4);

0.4 part by weight of a cresole/formaldehyde novolak modified with chloroacetic acid (described in Example 5 of German Pat. No. 1,053,930); and 1.3 parts by weight of 2,2-bis-(4-hydroxy-3,5-dihydroxymethyl-phenyl)-propane in 35 parts by weight of ethylene glycol monomethyl ether and 40 parts by weight of tetrahydrofuran.

The light-sensitive printing plate thus prepared is exposed under a transparent negative original and then developed with a 1% strength sodium metasilicate solution.

A baking time of 10 minutes at 160° C. is adequate for the hardening of the printing stencil, as well as for the associated lengthening of the print run and the resistance to solvents.

EXAMPLE 5

An electrolytically roughened and anodized aluminum plate is coated with a solution of
- 1.6 parts by weight of the esterification product obtained from 1 mole of 2,4-dihydroxy-3,5-dibromobenzophenone and 2 moles of naphthoquinone-(1,2)-diazide-(2)-5-sulfonic acid chloride;
- 4.6 parts by weight of the novolak indicated in Example 1;
- 1.3 parts by weight of bis-(4-hydroxy-3,5-bis-hydroxymethyl-phenyl)-methane;
- 0.05 part by weight of crystal violet; and
- 0.03 part by weight of Sudan Yellow GGN (C. I. 11,021) in
- 35 parts by weight of ethylene glycol monomethyl ether and
- 45 parts by weight of tetrahydrofuran.

A baking time of 12 minutes at 175° C. is adequate for the hardening of the printing stencil.

Bis-(4-hydroxy-3,5-bis-hydroxymethyl-phenyl)-methane (melting point 145° C.) is prepared in accordance with the instructions of F. Seebach [Chem. Ber. 73 (1940), 1338, and Chem. Ber. 72 (1939), 1636].

EXAMPLE 6

An electrochemically roughened and anodized aluminum plate which has been treated with polyvinylphosphonic acid is coated with a solution of
- 1.1 parts by weight of the esterification product obtained from 1 mole of 2,3,4-trihydroxy-benzophenone and 2 moles of naphthoquinone-(1,2)-diazide-(2)-5-sulfonic acid chloride;
- 0.8 part by weight of the esterification product obtained from 1 mole of 2,2'-dihydroxy-dinaphthyl-(1,1')-methane and 2 moles of naphthoquinone-(1,2)-diazide-(2)-5-sulfonic acid chloride;
- 4.2 parts by weight of the novolak indicated in Example 1;
- 0.1 part by weight of naphthoquinone-(1,2)-diazide-(2)-4-sulfonic acid chloride;
- 1.4 parts by weight of 2,2-bis-(4-hydroxy-3,5-bis-hydroxy-methylphenyl)-trichloroethane; and
- 0.07 part by weight of crystal violet in
- 40 parts by weight of ethylene glycol monomethyl ether and
- 50 parts by weight of tetrahydrofuran.

A baking time of 12 minutes at 170° C. is adequate for the hardening of the printing stencil, as well as for the associated lengthening of the print run and the resistance to solvents.

The starting material for the preparation of the hydroxymethylphenol derivative indicated above, namely 2,2-bis-(4-hydroxy-phenyl)-trichloroethane, melting point: 200° C., is obtained in a good yield by the method of ELBS (J. prakt. Chem. 47, (1893), page 60) by a condensation of phenol and chloral in glacial acetic acid, in the presence of concentrated sulfuric acid.

EXAMPLE 7

An electrochemically roughened and anodized aluminum plate is coated with a solution of
- 2.8 parts by weight of a 50% strength solution of a poly-ortho-ester, prepared from 7,7-bis-hydroxymethyl-5-oxa-nonan-(1)-ol and trimethyl orthoformate, in toluene;
- 0.23 part by weight of 2,4-bis-(trichloromethyl)-6-(4-ethoxy-naphth-1-yl)-s-triazine;
- 3.3 parts by weight of the novolak indicated in Example 1;
- 1.33 parts by weight of 2,2-bis-(4-hydroxy-3,5-bis-hydroxy-methyl-phenyl)-propane; and
- 0.04 part by weight of crystal violet in
- 90 parts by weight of butanone.

The printing plate thus prepared is exposed imagewise for 10 seconds at a distance of 110 cm under a 5 kW metal halide lamp and than developed with the developer indicated in Example 1.

A baking time of 10 minutes at 180° C. is adequate for the hardening of the printing stencil.

In the place of the poly-ortho-ester indicated above, it is also possible, with a similar result, to use a polyacetal, for example, 1.4 parts by weight of the polyacetal obtained from triethylene glycol and 2-ethyl-butyraldehyde.

What is claimed is:

1. A light-sensitive mixture, comprising:
    a water-insoluble binder which is soluble in aqueous-alkaline solutions;
    a light-sensitive component selected from o- or p-quinone-diazides or a mixture of
    (a) a compound which generates or splits off an acid on exposure to light and
    (b) a compound having at least one C—O—C group which can be cleaved by acid; and
    a phenol derivative comprising a compound having from 1 to 3 benzene nuclei which are mutually linked by single bonds, carbonyl groups, ether groups, thioether groups or unsubstitutd or substituted methylene groups, and having at least one phenolic hydroxyl group and at least two substituents of the formula —CH$_2$OR, in which R denotes hydrogen or a lower alkyl or acyl group.

2. A light-sensitive mixture as claimed in claim 1, wherein the phenol derivative is substituted in the 4-position relative to the hydroxyl group.

3. A light-sensitive mixture as claimed in claim 1, wherein the phenol derivative comprises a compound of formula II

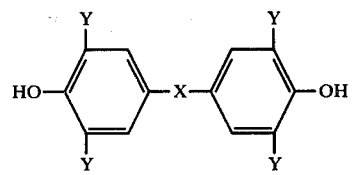

in which X denotes a single bond or one of the groups S, O, CO or CR$_1$R$_2$ and Y denotes hydrogen or a CH$_2$OR group, R having the meaning given above, and R$_1$ and R$_2$ are identical or different and denote hydrogen or substituted or unsubstituted alkyl groups which can be linked together to form a ring, and wherein not more than two Y substituents are hydrogen.

4. A light-sensitive mixture as claimed in claim 2, wherein the phenol derivative is substituted by alkyl, alkoxy, cycloalkyl, aralkyl or acyl groups or by halogen.

5. A light-sensitive mixture as claimed in claim 1 or 3, wherein R is a hydrogen atom.

6. A light-sensitive mixture according to claim 1, wherein the phenol derivative is present in a quantity of from about 5 to 60% by weight, relative to the weight of non-volatile constituents therein.

7. A light-sensitive mixture as claimed in claim 1, wherein the light-sensitive compound comprises a 1,2-naphthoquinone-2-diazide derivative.

8. A light-sensitive mixture as claimed in claim 1, wherein the binder which is soluble in aqueous-alkaline solutions comprises a novolak.

9. A light-sensitive copying material, comprising: a support and light-sensitive layer on said support, said light-sensitive layer comprising a light-sensitive mixture as defined by claim 1.

10. A light-sensitive mixture as claimed in claim 3, wherein Y denotes a $CH_2OR$ group.

11. A light-sensitive mixture as claimed in claim 3, wherein X is a methylene group.

12. A light-sensitive mixture as claimed in claim 11 wherein X is a substituted methylene group.

13. A light-sensitive mixture as claimed in claim 12, wherein X is prop-2,2-ylene.

14. A light-sensitive mixture as claimed in claim 3, wherein said phenol derivative is selected from 2,2-bis-(4-hydroxy-3,5-bishydroxy-methyl-phenyl)propane; 1,1-bis-(4-hydroxy-3,5-bishydroxy-methyl-phenyl)-cyclohexane; bis-(4-hydroxy-3,5-bishydroxy-methyl-phenyl)-methane; or 2,2-bis-(4-hydroxy-3,5-bishydroxy-methyl-phenyl)-trichloroethane.

15. A light-sensitive mixture as claimed in claim 2, wherein the 4-position substituent is selected from an alkyl group having 1 to 12 carbon atoms, a cycloalkyl group having 5 to 8 carbon atoms, an alkoxy group having 1 to 5 carbon atoms, an aryl group having 6 to 10 carbon atoms, an aralkyl group having 7 to 10 carbon atoms, or a chlorine or bromine atom.

16. A light-sensitive mixture as claimed in claim 15, wherein said phenol derivative comprises 4-methyl-2,6-bis-hydroxymethyl-phenol.

17. A process for preparing a printing form comprising the steps of:
  imagewise exposing a light-sensitive copying material comprising a support and a light-sensitive layer on said support, said light-sensitive layer comprising a water-insoluble binder, which is soluble in aqueous-alkaline solutions, a light-sensitive component selected from o- or p-quinone diazides or a mixture of
   (a) a compound which generates or splits off an acid on exposure to light and
   (b) a compound having at least one C—O—C group which can be cleaved by acid,
  and a phenol derivative comprising a compound having 1 to 3 benzene nuclei which are mutually linked by single bonds, carbonyl groups, ether groups, thioether groups or unsubstituted or substituted methylene groups, and having at least one phenolic hydroxyl group and at least two substituents of the formula —$CH_2OR$, in which R denotes hydrogen or a lower alkyl or acyl group;
  washing out the non-image areas with an aqueous-alkaline developer solution; and
  heating the developed printing form to an elevated temperature sufficient to harden the image layer.

18. A process as claimed in claim 17, wherein the developed printing form is heated to a temperature in the range of from about 150° to 240° C.

19. A process as claimed in claim 17, wherein the developed printing form is heated for about 1 to 20 minutes.

20. A process as claimed in claim 10, wherein the developed printing form is heated to a temperature in the range of from about 160° to 210° C. for a period of time of from about 5 to 15 minutes.

* * * * *

UNITED STATES PATENT AND TRADEMARK OFFICE
CERTIFICATE OF CORRECTION

PATENT NO. : 4,387,152
DATED : June 7, 1983
INVENTOR(S) : Paul STAHLHOFEN

It is certified that error appears in the above-identified patent and that said Letters Patent is hereby corrected as shown below:

Column 6, line 8, kindly delete "esters" and insert instead -- ethers --.

Column 6, line 46, kindly delete "usefl" and insert instead -- useful --.

Signed and Sealed this

Sixth Day of September 1983

[SEAL]

Attest:

GERALD J. MOSSINGHOFF

Attesting Officer

Commissioner of Patents and Trademarks